(12) United States Patent
Aramaki (10) Patent No.: US 9,944,840 B2
(45) Date of Patent: Apr. 17, 2018

(54) METHOD OF PRODUCING HEAT CONDUCTIVE SHEET

(71) Applicant: DEXERIALS CORPORATION, Tokyo (JP)

(72) Inventor: Keisuke Aramaki, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 169 days.

(21) Appl. No.: 14/402,195

(22) PCT Filed: Jul. 8, 2013

(86) PCT No.: PCT/JP2013/068667
§ 371 (c)(1),
(2) Date: Nov. 19, 2014

(87) PCT Pub. No.: WO2014/010563
PCT Pub. Date: Jan. 16, 2014

(65) Prior Publication Data
US 2015/0144316 A1  May 28, 2015

(30) Foreign Application Priority Data
Jul. 7, 2012 (JP) .................................. 2012-153146

(51) Int. Cl.
*B29C 47/00* (2006.01)
*C09K 5/14* (2006.01)
(Continued)

(52) U.S. Cl.
CPC ................ *C09K 5/14* (2013.01); *B29C 43/02* (2013.01); *B29C 47/004* (2013.01);
(Continued)

(58) Field of Classification Search
CPC ...... C09K 5/14; B29C 47/004; B29C 47/0019; B29C 43/02; B29C 47/0066; F28F 21/02;
(Continued)

(56) References Cited

U.S. PATENT DOCUMENTS

| 8,808,607 B2* | 8/2014 | Usui | ...................... C08J 5/18 |
| | | | 264/104 |
| 9,057,569 B2* | 6/2015 | Miyashita | ........... H01L 23/3731 |
| 2013/0136895 A1 | 5/2013 | Usui et al. | |

FOREIGN PATENT DOCUMENTS

| EP | 1 041 627 A2 | 10/2000 |
| EP | 2267081 A1 | 12/2010 |

(Continued)

OTHER PUBLICATIONS

Nov. 27, 2015 Office Action issued in Taiwanese Patent Application No. 102124477.
(Continued)

*Primary Examiner* — Richard Chang
(74) *Attorney, Agent, or Firm* — Oliff PLC (57) ABSTRACT

A method of producing a heat conductive sheet includes: a step (A) of dispersing a fibrous filler and a spherical filler in a binder resin to prepare a heat conductive sheet-forming composition; a step (B) of forming a molded block using the prepared heat conductive sheet-forming composition; a step (C) of slicing the formed molded block to a desired thickness to form a sheet; and a step (D) of pressing the sliced surface of the formed sheet, the sliced surface being pressed such that the thermal resistance value of the sheet after pressing becomes lower than the thermal resistance value of the sheet before pressing.

11 Claims, 1 Drawing Sheet

(51) Int. Cl.
*C08J 5/18* (2006.01)
*H05K 7/20* (2006.01)
*H01L 23/373* (2006.01)
*H01L 21/48* (2006.01)
*B29D 7/01* (2006.01)
*F28F 21/02* (2006.01)
*B29C 43/02* (2006.01)
*B29C 47/08* (2006.01)
*B29K 83/00* (2006.01)
*B29K 505/00* (2006.01)
*B29K 507/04* (2006.01)
*B29K 509/02* (2006.01)
*B29K 509/08* (2006.01)

(52) U.S. Cl.
CPC ............ *B29C 47/0019* (2013.01); *B29D 7/01* (2013.01); *C08J 5/18* (2013.01); *F28F 21/02* (2013.01); *H01L 21/4878* (2013.01); *H01L 23/3737* (2013.01); *H05K 7/20481* (2013.01); B29C 47/0066 (2013.01); B29C 47/0869 (2013.01); B29C 2793/0027 (2013.01); B29K 2083/005 (2013.01); B29K 2505/00 (2013.01); B29K 2507/04 (2013.01); B29K 2509/02 (2013.01); B29K 2509/08 (2013.01); B29K 2995/0013 (2013.01); C08J 2383/04 (2013.01); C08J 2383/05 (2013.01); C08J 2383/07 (2013.01); H01L 2924/0002 (2013.01); Y10T 428/31663 (2015.04)

(58) Field of Classification Search
CPC ... B29D 7/01; H01L 23/3737; H01L 21/4878; C08J 5/18; H05K 7/20481; Y10T 428/31663; B29K 2505/00; B29K 2509/02
See application file for complete search history.

(56) References Cited

FOREIGN PATENT DOCUMENTS

| JP | A-56-166019 | 12/1981 |
| JP | 2002088171 A | 3/2002 |
| JP | A-2005-347616 | 12/2005 |
| JP | A-2007-84649 | 4/2007 |
| JP | A-2008-211021 | 9/2008 |
| JP | A-2009-215404 | 9/2009 |
| JP | B2-4814550 | 11/2011 |
| JP | 2012023335 A | 2/2012 |
| TW | 201209972 A | 3/2012 |
| WO | WO 2011/158942 A1 | 12/2011 |

OTHER PUBLICATIONS

Mar. 3, 2016 Extended Search Report in European Patent Application No. 13816807.5.
Apr. 21, 2015 Office Action issued in Taiwanese Patent Application No. 102124477.
Nov. 28, 2014 Office Action issued in Taiwanese Application No. 102124311.
International Search Report issued in PCT/JP2013/068667 dated Oct. 8, 2013 (with translation).
Feb. 8, 2017 Extended Search Report issued in European Patent Application No. 16002337.0.
Oct. 12, 2016 Office Action issued in Taiwanese Patent Application No. 104106473.
Dec. 15, 2017 Office Action issued in Taiwanese Patent Application No. 106117174.

* cited by examiner

METHOD OF PRODUCING HEAT CONDUCTIVE SHEET

TECHNICAL FIELD

The present invention relates to a method of producing a heat conductive sheet.

BACKGROUND ART

To prevent failure of a heat generating body such as an IC chip which generates heat during operation, the heat generating body is brought into intimate contact with a heat dissipator such as a heat dissipation fin through a heat conductive sheet. An idea recently proposed to improve the heat conductivity of such a heat conductive sheet is to produce the heat conductive sheet by orienting a fibrous filler in a direction of the thickness of a laminar thermosetting resin composition, in which the fibrous filler is dispersed in a thermosetting resin, using a magnetic field generator and then curing the thermosetting resin (Patent Literature 1). In this heat conductive sheet, ends of the fibrous filler are exposed at the surface of the sheet. When the heat conductive sheet is applied between a heat generating body and a heat dissipator, the exposed ends of the fibrous filler are embedded into the heat conductive sheet.

CITATION LIST

Patent Literature

Patent Literature 1: Japanese Patent No. 4814550

SUMMARY OF INVENTION

Technical Problem

However, the technique in Patent Literature 1 has a problem in that the high-cost magnetic field generator must be used to orient the fibrous filler in an intended direction. To orient the fibrous filler using the magnetic field generator, the viscosity of the thermosetting resin composition must be low, so that the contained amount of the fibrous filler cannot be increased greatly. A problem in this case is that the heat conductivity of the heat conductive sheet is insufficient. Another problem is that, depending on the conditions under which the heat conductive sheet is applied between the heat generating body and the heat dissipator, the exposed ends of the fibrous filler are not embedded into the heat conductive sheet. Another problem in this case is that, to fully embed the exposed ends of the fibrous filler into the heat conductive sheet, a load that may interfere with the normal operation of the heat generating body and the heat dissipator is necessarily applied thereto when the heat conductive sheet is disposed between the heat generating body and the heat dissipator.

It is an object of the present invention to solve the above-described problems in the conventional technology. More specifically, it is an object to enable a heat conductive sheet exhibiting favorable heat conductivity to be produced without using a high-cost magnetic field generator while allowing a large amount of the fibrous filler to be contained in the thermosetting resin composition, so that favorable heat conductivity is obtained without applying a load, which may interfere with the normal operation of the heat generating body and the heat dissipator, to the heat generating body and the heat dissipator when the heat conductive sheet is disposed therebetween.

Solution to Problem

The present inventor has conducted studies on the orientation state of the fibrous filler under the assumption that the main cause of the problems in the conventional technique is that the fibrous filler is oriented in the direction of the thickness of the heat conductive sheet. The inventor has found that a heat conductive sheet that allows the above object to be achieved can be produced by adding a relatively large amount of a fibrous filler to a binder resin to prepare a heat conductive sheet-forming composition, forming a molded block from the heat conductive sheet-forming composition by simply using a known molding method (preferably an extrusion molding method or a die molding method) without intentionally orienting the fibrous filler using a magnetic field generator, then slicing the molded block to form a sheet, and subjecting the formed sheet to a pressing treatment. Thus, the present invention has been completed.

Accordingly, the present invention provides a method of producing a heat conductive sheet, the method comprising the following Steps (A) to (D):

Step (A)
a step of dispersing a fibrous filler and a spherical filler in a binder resin to prepare a heat conductive sheet-forming composition;

Step (B)
a step of forming a molded block using the prepared heat conductive sheet-forming composition;

Step (C)
a step of slicing the formed molded block to a desired thickness to form a sheet; and Step (D)
a step of pressing a sliced surface of the formed sheet, the sliced surface being pressed such that a thermal resistance value of the sheet after pressing becomes lower than the thermal resistance value of the sheet before pressing, wherein the fibrous filler in the step (A) is a carbon fiber having an average diameter of 8 to 12 µm and an aspect ratio of 2 to 50, the amounts of the fibrous filler and the spherical filler added to the heat conductive sheet-forming composition are 16 to 40% by volume and 30 to 60% by volume, respectively, and the thermal resistance value ($K \cdot cm^2/W$) of the sheet before pressing that is formed in the step (C) is controlled to 0.31 to 1.00.

The present invention also provides a heat conductive sheet obtained by the above production method and a thermal device including a heat generating body, a heat dissipator, and the heat conductive sheet disposed between the heat generating body and the heat dissipator.

The present invention further provides a heat conductive sheet produced by pressing a sheet formed from a molded block composed of a heat conductive sheet-forming composition, wherein the heat conductive sheet-forming composition is prepared by dispersing a fibrous filler and a spherical filler in a binder resin, the fibrous filler is a carbon fiber having an average diameter of 8 to 12 µm and an aspect ratio of 2 to 50, the heat conductive sheet-forming composition contains 16 to 40% by volume of the fibrous filler and 30 to 60% by volume of the spherical filler, and a random orientation ratio of the fibrous filler in the molded block is controlled within the range of 55 to 95%, whereby a thermal resistance value (K·cm$^2$/W) of the sheet before pressing that is formed from the molded block is in the range of 0.31 to 1.00.

Advantageous Effects of Invention

According to the production method of the present invention, the heat conductive sheet-forming composition is prepared by adding not only a carbon fiber used as the fibrous filler but also the spherical filler to the binder resin, and the total amount of the fibrous filler and spherical filler added is relatively large. Preferably, the molded block is formed such that the fibrous filler is oriented randomly, and the thermal resistance value (K·cm$^2$/W) of the sheet before pressing treatment that is obtained by slicing the molded block is intentionally set to a high value within the range of 0.31 to 1.00.

In the molded block and the sheet obtained by slicing the molded block, the fibrous filler is not oriented in a certain direction (i.e., are randomly oriented). Therefore, contact between the fibrous fillers is facilitated during pressing in the second next Step (D). When the fibrous filler is oriented in a certain direction, particularly, in a direction parallel or orthogonal to the direction of pressing, it is not expected that the fibrous fillers come into contact with each other by pressing. However, when the fibrous filler is intentionally oriented randomly as in the present invention, the flow or deformation of the binder resin causes the fibrous fillers to come into contact with each other within the sheet, so that a heat conductive sheet with the heat conductivity in the sheet improved in the subsequent steps can be produced. In addition, since the surface of the sheet can be smoothened, its adhesion to a heat generating body and a heat dissipator is favorable. Therefore, a heat conductive sheet can be produced which exhibits favorable heat conductivity without applying a load, which may interfere with the normal operation of the heat generating body and the heat dissipator, to the heat generating body and the heat dissipator when the heat conductive sheet is disposed therebetween.

DESCRIPTION OF EMBODIMENTS

Figure 1:
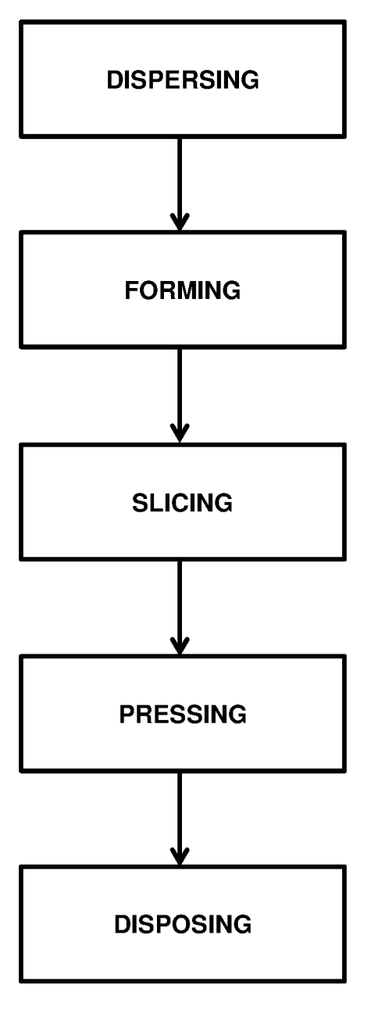
FIG. 1 is a schematic diagram illustrating a method of producing a heat conductive sheet according to an embodiment.

A method of producing a heat conductive sheet according to the present invention includes the following Steps (A) to (D). Each of these steps will be described in detail, with reference to FIG. 1.

<Step (A)>

First, a fibrous filler is dispersed in a binder resin to prepare a heat conductive sheet-forming composition.

The fibrous filler constituting the heat conductive sheet-forming composition is used to allow heat from a heat generating body to be effectively transferred to a heat dissipator. If the average diameter of the fibrous filler is too small, the specific surface area thereof becomes excessively large, so that the viscosity of the heat conductive sheet-forming composition may become excessively high. If the average diameter is too large, the surface irregularities of the heat conductive sheet become large, so that its adhesion to the heat generating body and the heat dissipator may deteriorate. Therefore, the average diameter is preferably 8 to 12 μm. If the aspect ratio (length/diameter) of the fibrous filler is too small, the viscosity of the heat conductive sheet-forming composition tends to become excessively high. If the aspect ratio is too large, compression of the heat conductive sheet tends to be inhibited. Therefore, the aspect ratio is preferably 2 to 50, and more preferably 3 to 30.

Preferred specific examples of the fibrous filler include carbon fibers, metal fibers (such as fibers of nickel and iron), glass fibers, and ceramic fibers (nonmetallic inorganic fibers such as fibers of oxides (for example, aluminum oxide, silicon dioxide, etc.), nitrides (for example, boron nitride, aluminum nitride, etc.), borides (for example, aluminum diboride etc.), and carbides (for example, silicon carbide etc.)).

The fibrous filler is selected according to the properties required for the heat conductive sheet such as mechanical properties, thermal properties, and electric properties, and carbon fibers can be particularly preferably used. Particularly, pitch-based carbon fibers can be preferably used because of their high elastic modulus, favorable heat conductivity, high electric conductivity, radio shielding properties, low thermal expansion, etc. In the following paragraphs, the term "fibrous filler" means a carbon fiber unless otherwise specified.

If the contained amount of the fibrous filler in the heat conductive sheet-forming composition is too small, the heat conductivity tends to become low. If the contained amount is too large, the viscosity tends to become high. Therefore, the contained amount of the fibrous filler in the heat conductive sheet is controlled by adjusting the added amounts of various materials and is preferably 16 to 40 vol %. The contained amount based on 100 parts by mass of a binder resin described later and constituting the heat conductive sheet-forming composition is preferably 120 to 300 parts by mass and more preferably 130 to 250 parts by mass.

In addition to the fibrous filler, a plate-like filler, a scale-like filler, a spherical filler, etc. may be used so long as the effects of the present invention are not impaired. In particular, from the viewpoint of suppressing secondary aggregation of the fibrous filler in the heat conductive sheet-forming composition, a spherical filler having a diameter of 0.1 to 5 μm (preferably spherical alumina or spherical aluminum nitride) is used in the range of preferably 30 to 60% by volume and more preferably 35 to 50% by volume. The used amount of the spherical filler based on 100 parts by mass of the fibrous filler is preferably 100 to 900 parts by mass.

The binder resin is used to hold the fibrous filler in the heat conductive sheet and is selected according to the properties required for the heat conductive sheet such as mechanical strength, heat resistance, electric properties, etc. Such a binder resin may be selected from thermoplastic resins, thermoplastic elastomers, and thermosetting resins.

Examples of the thermoplastic resins include: polyethylene, polypropylene, ethylene-α olefin copolymers such as ethylene-propylene copolymers, polymethylpentene, polyvinyl chloride, polyvinylidene chloride, polyvinyl acetate, ethylene-vinyl acetate copolymers, polyvinyl alcohol, polyvinyl acetal, fluorine-based polymers such as polyvinylidene fluoride and polytetrafluoroethylene, polyethylene terephthalate, polybutylene terephthalate, polyethylene naphthalate, polystyrene, polyacrylonitrile, styrene-acrylonitrile copolymers, acrylonitrile-butadiene-styrene copolymer (ABS) resins, polyphenylene-ether copolymer (PPE) resins, denatured PPE resins, aliphatic polyamides, aromatic polyamides, polyimide, polyamide-imide, polymethacrylic acid, polymethacrylates such as polymethyl methacrylate, polyacrylic acids, polycarbonates, polyphenylene sulfide, polysulfones, polyethersulfone, polyethernitrile, polyether ketone, polyketone, liquid crystal polymers, silicone resins, and ionomers.

Examples of the thermoplastic elastomers include styrene-butadiene block copolymers and hydrogenated products thereof, styrene-isoprene block copolymers and hydrogenated products thereof, styrene-based thermoplastic elastomers, olefin-based thermoplastic elastomers, vinyl chloride-based thermoplastic elastomers, polyester-based thermoplastic elastomers, polyurethane-based thermoplastic elastomers, and polyamide-based thermoplastic elastomers.

Examples of the thermosetting resins include cross-linked rubber, epoxy resins, phenolic resins, polyimide resins, unsaturated polyester resins, and diallyl phthalate resins. Specific examples of the cross-linked rubber include natural rubber, acrylic rubber, butadiene rubber, isoprene rubber, styrene-butadiene copolymer rubber, nitrile rubber, hydrogenated nitrile rubber, chloroprene rubber, ethylene-propylene copolymer rubber, chlorinated polyethylene rubber, chlorosulfonated polyethylene rubber, butyl rubber, halogenated butyl rubber, fluorocarbon rubber, urethane rubber, and silicone rubber.

The heat conductive sheet-forming composition can be prepared by uniformly mixing the fibrous filler and the binder resin with various additives and a volatile solvent that are added as needed using any known mixing method.

<Step (B)>

Next, a molded block is formed from the prepared heat conductive sheet-forming composition by any known molding method. In this case, it is preferable to use a molding method that does not cause the fibrous filler to be oriented in a certain direction. Particularly preferably, the molded block is formed by an extrusion molding method or a die molding method.

No particular limitation is imposed on the extrusion molding method and die molding method used, and an appropriate method may be selected from various known extrusion molding methods and die molding methods according to the viscosity of the heat conductive sheet-forming composition and the properties required for the heat conductive sheet.

When the heat conductive sheet-forming composition is extruded from a mold used in the extrusion molding method or when the heat conductive sheet-forming composition is injected into a mold used in the die molding method, the binder resin flows, and part of the fibrous filler is oriented in the direction of the flow, but the majority of the fibrous filler is oriented randomly. In this case, if the ratio of the fibrous filler randomly oriented to all the fibrous filler (the random orientation ratio of the fibrous filler) is too small, the ratio of the fibrous fillers in contact with each other after pressing in Step (D) described later becomes small, so that the heat conductivity of the heat conductive sheet tends to be insufficient. If the random orientation ratio is too high, the heat conductivity of the sheet in its thickness direction may become insufficient. Therefore, the random orientation ratio is preferably 55 to 95% and more preferably 60 to 90%. The random orientation ratio of the fibrous filler can be counted by observation under an electron microscope.

The state in which the random orientation ratio is 0% means the state in which all the fibrous fillers contained in a unit cube (for example, a cube of side 0.5 mm) are oriented in a certain direction (for example, the direction of the thickness of the sheet). The state in which the random ratio is 100% means the state in which the fibrous fillers contained in a unit cube (for example, a cube of side 0.5 mm) do not include a group of fibrous fillers oriented in a certain direction (for example, the direction of the thickness of the sheet). The state in which the random orientation ratio is 50% means the state in which the ratio of the fibrous filler contained in a group of fibrous fillers oriented in a certain direction (for example, the direction of the thickness of the sheet) to all the fibrous fillers contained in a unit cube (for example, a cube of side 0.5 mm) is 50%. Therefore, the state in which the random orientation ratio is 55% means the state in which the ratio of the fibrous filler contained in a group of fibrous fillers oriented in a certain direction (for example, the direction of the thickness of the sheet) to all the fibrous fillers contained in a unit cube (for example, a cube of side 0.5 mm) is 45%. The state in which the random orientation ratio is 95% means the state in which the ratio of the fibrous filler contained in a group of fibrous fillers oriented in a certain direction (for example, the direction of the thickness of the sheet) to all the fibrous fillers contained in a unit cube (for example, a cube of side 0.5 mm) is 5%.

The random orientation ratio can be computed by observing a cross section of the sheet and excluding the fibrous filler oriented in the thickness direction and having a prescribed length. The numerical accuracy of the random orientation ratio can be improved by increasing the number of observed cross sections and averaging the obtained values of the random orientation ratio.

The size and shape of the molded block may be determined according to the required size of the heat conductive sheet. Examples of the molded block include a cuboid having a cross section with a vertical length of 0.5 to 15 cm and a horizontal length of 0.5 to 15 cm. The length of the cuboid may be determined as needed.

<Step (C)>

Next, the formed molded block is sliced to form a sheet. The degree of orientation of the fibrous filler in the molded block is assumed to be substantially the same as that in the sheet obtained by slicing the molded block. The fibrous filler is exposed at the surface (the sliced surface) of the sheet obtained by slicing. No particular limitation is imposed on the method of slicing, and an appropriate apparatus can be selected from known slicing apparatuses (preferably ultrasonic cutters) according to the size and mechanical strength of the molded block. When an extrusion molding method is used as the molding method, some fibrous fillers are oriented in the direction of extrusion. Therefore, the direction in which the molded block is sliced is 60 to 120° and more preferably 70 to 100° with respect to the direction of extrusion. The direction is particularly preferably 90° (orthogonal to the direction of extrusion).

As described above, in the sheet obtained by slicing the molded block, the random orientation ratio of the molded block is maintained. In addition, when a carbon fiber is designated as the fibrous filler used and the shape and the amount added of the carbon fiber are specified, the thermal resistance value of the sheet before pressing can be limited within a prescribed range. More specifically, when a carbon fiber having an average diameter of 8 to 12 μm and an aspect ratio of 2 to 50 is used as the fibrous filler and the contained amount of the fibrous filler and the contained amount of the spherical filler are set to be 16 to 40% by volume and 30 to GO % by volume, respectively, the thermal resistance value before pressing in Step (D) described later is performed (before pressing) can be more than 0.31 and less than 1.00. When the thermal resistance value is measured, a load of 1 kg/cm² is applied to the sheet.

No particular limitation is imposed on the width at which the molded block is sliced (the thickness of the formed sheet), and the width may be appropriately selected according to, for example, the intended purpose of the heat conductive sheet. As for the relationship between the thermal resistance value and the width at which the molded block is sliced in step (C) (the thickness of the formed sheet), when the molded block is sliced such that the width of the sheet formed is less than 0.65 mm, the thermal resistance value (K·cm$^2$/W) of the sheet is preferably in the range of more than 0.31 and less than 0.47. When the molded block is sliced such that the width is 0.65 mm or more and 3 mm or less, the thermal resistance value (K·cm$^2$/W) of the sheet is preferably in the range of more than 0.47 and less than 1.00.

<Step (D)>

Next, the sliced surface of the obtained sheet is pressed. A heat conductive sheet is thereby obtained. To perform pressing, a pair of presses each including a flat plate and a pressing head having a flat surface may be used. The sheet may be pressed using pinch rolls.

Generally, if the pressure during pressing is too low, the thermal resistance tends to be unchanged from that of the unpressed sheet. If the pressure is too high, the sheet tends to be stretched. When a spacer is interposed to prevent stretching during pressing, the pressing pressure can be set to be slightly high. The pressure applied to the sheet is generally 1 to 100 kgf/cm$^2$. However, when no spacer is used, the pressure is preferably 2 to 8 kgf/cm$^2$ and more preferably 3 to 7 kgf/cm$^2$. When a spacer is used, the set pressure during pressing is 0.1 to 30 MPa and preferably 0.5 to 20 MPa.

In the present invention, a frame or plate formed of a hard material and having the same thickness as the thickness of the sheet to be formed may be used as the spacer. For example, as the spacer, a frame produced by forming 4 square holes (for example, square holes of side 10 cm) in a square stainless steel plate (for example, a square plate of side 25 cm) having the same thickness as the thickness of the sheet to be formed is exemplified which has a square frame shape with a cross inside like a Japanese Kanji character "田", but this is not a limitation.

Preferably, the pressing is performed at a temperature equal to or higher than the glass transition temperature of the binder resin, in order to increase the effect of pressing and to reduce the pressing time. The sheet is pressed within the temperature range of generally 0 to 180° C., preferably room temperature (about 25° C.) to 100° C., and more preferably 30 to 100° C.

In the present invention, the sheet after pressing is reduced in thickness by compression. If the compression ratio of the sheet [{(thickness of sheet before pressing−thickness of sheet after pressing)/(thickness of sheet before pressing)}×100] is too small, the thermal resistance tends not to be reduced. If the compression ratio is too high, the sheet tends to be stretched. Therefore, the pressing is performed such that the compression ratio is 2 to 15%.

The surface of the sheet may be smoothened by pressing. The degree of smoothness can be evaluated by the surface glossiness (gloss value). If the surface glossiness is too small, the heat conductivity becomes low. Therefore, it is preferable to perform pressing such that the surface glossiness (gloss value) measured using a glossmeter with an incident angle of 60° and a reflection angle of 60° is 0.2 or higher.

The heat conductive sheet obtained by the above-described heat conductive sheet production method is also one embodiment of the present invention. In a preferred embodiment, the random orientation ratio of the fibrous filler is 55 to 95%, the thickness of the sheet is 0.1 to 50 mm, and the surface glossiness (gloss value) measured using the glossmeter is 0.2 or higher.

Such a heat conductive sheet can provide a thermal device having a structure in which the heat conductive sheet is disposed between a heat generating body and a heat dissipator to dissipate the heat generated in the heat generating body to the heat dissipator. Examples of the heat generating body include IC chips and IC modules, and examples of the heat dissipator include heat sinks formed of metal materials such as stainless steel.

As described above, the thermal properties of the heat conductive sheet largely depend on the random orientation ratio of the contained fibrous filler. The thermal properties can also be evaluated by variations in angles of the oriented fibrous filler with respect to the direction of the thickness of the sheet. More specifically, optical microscope images of a cross section of the heat conductive sheet are taken at a magnification of 50 to 300, and it is supposed that the surface direction of the sheet is assigned to 90°. Then the distribution of the angles of the fibrous filler is determined, and the standard deviation of the distribution is determined. Preferably, the standard deviation is 10° or larger.

The heat conductive sheet itself obtained by the production method of the present invention can be represented as a "product" as follows and serves as one embodiment of the present invention.

The heat conductive sheet of the present invention is a "heat conductive sheet produced by pressing a sheet formed from a molded block composed of a heat conductive sheet-forming composition, wherein the heat conductive sheet-forming composition is prepared by dispersing a fibrous filler and a spherical filler in a binder resin, the fibrous filler is a carbon fiber having an average diameter of 8 to 12 μm and an aspect ratio of 2 to 50, the heat conductive sheet-forming composition contains 16 to 40% by volume of the fibrous filler and 30 to 60% by volume of the spherical filler, and the random orientation ratio of the fibrous filler in the molded block is controlled within the range of 55 to 95%, whereby the thermal resistance value (K·cm$^2$/W) of the sheet before pressing that is formed from the molded block is in the range of 0.31 to 1.00."

The structure of the invention in this heat conductive sheet is the same value as that described in the production method of the present invention, and the effects of the invention in the heat conductive sheet are the same as those of the heat conductive sheet produced by the production method of the present invention.

EXAMPLES

Example 1

17% by volume of a silicone A liquid (organopolysiloxane having a vinyl group), 16% by volume of a silicone B liquid (organopolysiloxane having a hydrogensilyl group), 22% by volume of alumina particles (average particle diameter: 3 μm), 22% by volume of spherical aluminum nitride (average particle diameter: 1 μm), and 23% by volume of pitch-based carbon fibers (average major axis length: 150 μm, average axial diameter: 8 μm) were uniformly mixed to prepare a heat conductive sheet-forming silicone resin composition. In terms of parts by mass, 153 parts by mass of the pitch-based carbon fibers were mixed with respect to 100 parts by mass of the silicone resins to prepare the heat conductive sheet-forming silicone resin composition.

The heat conductive sheet-forming silicone resin composition was poured into a mold having a cuboidal internal space and thermally cured in an oven at 100° C. for 6 hours to produce a molded block. A polyethylene terephthalate release film had been applied to the inner surface of the mold with the release-treated surface of the film inward.

The obtained molded block was sliced using an ultrasonic cutter to a thickness of 0.2 mm to obtain a sheet. The shear force during slicing caused part of the fibrous filler to be exposed at the surface of the sheet, so that fine irregularities were formed on the surface of the sheet. While a load of 1 kgf/cm² was applied to the sheet, its thermal resistance [(K/W) and (K·cm²/W)] was measured using a thermal resistance measuring device according to ASTM-D5470. The obtained results are shown in TABLES 1a to 1d. The thermal resistance value was 0.41 K·cm²/W.

The thus-obtained sheet was placed on a stainless steel surface plate and pressed with a flat stainless steel pressing head having a mirror-finished surface at room temperature (25° C.) for 30 minutes such that a load of 2 kgf/cm² was applied to the sheet to thereby obtain a heat conductive sheet having a smooth surface. The thickness of the sheet before and after pressing and its compression ratio are shown in TABLES 1a to 1d.

Optical microscope images of the flat surface of the conductive sheet were taken at a magnification of 100, and it was supposed that the surface direction of the sheet is assigned to 90°. Then the taken images were saved, and the distribution of the angles of the fibrous filler was determined, and the standard distribution of the distribution was determined. The average in the angle distribution was −12.9°, and the standard deviation was 15.6°.

Examples 2 to 45 and Comparative Example 1

Heat conductive sheets were obtained by the same procedure as in Example 1 except that the slice thickness of the molded block and the pressing conditions (pressure and temperature) in the above Example were changed as shown in TABLEs 1a to 1d. The thickness of each sheet before and after pressing and its compression ratio are shown in TABLEs 1a to 1d.

Comparative Example 1

A heat conductive sheet was obtained by the same procedure as in Example 1 except that no pressing was performed.

Examples 46 to 51

Heat conductive sheets were obtained by the same procedure as in Example 1 except that the slice thickness of the molded block, the pressing conditions (pressure and temperature), the average major axis length (μm) and the average axial diameter (μm) of the pitch-based carbon fibers in the above Example were changed as shown in TABLEs 1a to 1d, that a spacer (produced by forming four 10-cm square holes in a 25 cm-square stainless steel plate having the same thickness as the thickness of a sheet to be formed) was used during pressing, that in Examples 46 and 47 240 parts by mass of the carbon fibers were mixed with 100 parts by mass of the silicone resins, and that in Examples 48 to 51 150 parts by mass of the carbon fibers were mixed with 100 parts by mass of the silicone resins. The thickness of each sheet before and after pressing and its compression ratio are shown in TABLEs 1a to 1d.

<Evaluation>

While a load of 1 kgf/cm² was applied to one of the obtained sheets, its thermal resistance [(K/W) and (K·cm²/W)] was measured using a thermal resistance measuring device according to ASTM-D5470. The results obtained are shown in TABLEs 1a to 1d. Practically, the thermal resistance is preferably 0.4 K/W (1.256 (K·cm²/W)) or less when the thickness of the sheet before pressing is 0.1 mm or more and less than 0.2 mm, is preferably 0.130 K/W (0.41 (K·cm²/W)) or less when the thickness of the sheet before pressing is 0.2 mm or more and less than 0.6 mm, is preferably 0.140 K/W (0.44 (K·cm²/W)) or less when the thickness of the sheet before pressing is 0.6 mm or more and less than 1.0 mm, and is preferably 0.5 K/W (1.57 (K·cm²/W)) or less when the thickness of the sheet before pressing is 1.0 mm or more and less than 3.0 mm.

The practically preferred upper limit of the thermal resistance when the thickness of the sheet before pressing is 0.1 mm or more and less than 0.2 mm is set to be higher than the practically preferred upper limit of the thermal resistance when the thickness of the sheet before pressing is 0.2 mm or more and less than 0.6 mm. This is because, if the thickness of the sheet is too small, the influence of the filler present in the sheet on the surface of the sheet becomes high, and the smoothness of the surface of the sheet is likely to be impaired.

In Examples 6, 10, 21, 25, and 46 to 51 and Comparative Example 1, the surface glossiness (gloss value) was measured using a glossmeter (incident angle: 60°, reflection angle: 60°). The results obtained are shown in TABLEs 1a to 1d.

TABLE 1a

|  | Example | | | | | | | |
| --- | --- | --- | --- | --- | --- | --- | --- | --- |
|  | 1 | 2 | 3 | 4 | 5 | 6 | 7 | 8 |
| Pressing temperature (° C.) | RT | RT | RT | RT | RT | RT | RT | RT |
| Thermal resistance before pressing (K/W) | 0.132 | 0.134 | 0.157 |  | 0.132 | 0.132 | 0.144 | 0.142 |
| Thermal resistance before pressing (K · cm²/W) | 0.414 | 0.421 | 0.493 |  | 0.414 | 0.414 | 0.452 | 0.446 |
| Pressing pressure (kgf/cm²) | 5 | 8 | 4 | 7 | 2 | 3 | 2 | 3 |
| Sheet thickness before pressing (mm) | 0.2 | 0.2 | 0.3 | 0.3 | 0.5 | 0.5 | 0.6 | 0.6 |

TABLE 1a-continued

|  | | | | | | | | |
|---|---|---|---|---|---|---|---|---|
| Sheet thickness after pressing (mm) | 0.161 | 0.143 | 0.251 | 0.235 | 0.448 | 0.407 | 0.532 | 0.487 |
| Compression ratio (%) | 19.5 | 28.5 | 16.3 | 21.7 | 10.4 | 18.6 | 11.3 | 18.8 |
| Thickness at measurement (mm) | 0.165 | 0.145 | 0.262 | 0.247 | 0.458 | 0.422 | 0.545 | 0.502 |
| Thermal resistance after pressing (K/W) | 0.050 | 0.038 | 0.057 | 0.045 | 0.09 | 0.074 | 0.092 | 0.084 |
| Thermal resistance after pressing (K·cm²/W) | 0.157 | 0.119 | 0.179 | 0.141 | 0.283 | 0.232 | 0.289 | 0.264 |
| Gloss value | — | — | — | — | — | 0.2 | — | — |

|  | Example | | | | | | |
|---|---|---|---|---|---|---|---|
|  | 9 | 10 | 11 | 12 | 13 | 14 | 15 |
| Pressing temperature (° C.) | 45 | 45 | 35 | 35 | 35 | 35 | 35 |
| Thermal resistance before pressing (K/W) |  |  |  |  | 0.132 | 0.132 | 0.145 |
| Thermal resistance before pressing (K·cm²/W) |  |  |  |  | 0.414 | 0.414 | 0.455 |
| Pressing pressure (kgf/cm²) | 5 | 3 | 2 | 3 | 2 | 3 | 2 |
| Sheet thickness before pressing (mm) | 0.2 | 0.2 | 0.3 | 0.3 | 0.5 | 0.5 | 0.6 |
| Sheet thickness after pressing (mm) | 0.166 | 0.17 | 0.268 | 0.253 | 0.445 | 0.404 | 0.526 |
| Compression ratio (%) | 17.0 | 15.0 | 10.7 | 15.7 | 11.0 | 12.0 | 12.3 |
| Thickness at measurement (mm) | 0.171 | 0.181 | 0.275 | 0.264 | 0.445 | 0.404 | 0.526 |
| Thermal resistance after pressing (K/W) | 0.037 | 0.039 | 0.061 | 0.049 | 0.088 | 0.074 | 0.091 |
| Thermal resistance after pressing (K·cm²/W) | 0.116 | 0.122 | 0.192 | 0.154 | 0.276 | 0.232 | 0.286 |
| Gloss value | — | 0.7 | — | — | — | — | — |

TABLE 1b

|  | Example | | | | | | | |
|---|---|---|---|---|---|---|---|---|
|  | 16 | 17 | 18 | 19 | 20 | 21 | 22 | 23 |
| Pressing temperature (° C.) | 35 | 80 | 80 | 80 | 80 | 80 | 80 | 80 |
| Pressing pressure (kgf/cm²) | 3 | 2 | 3 | 2 | 3 | 2 | 3 | 2 |
| Thermal resistance before pressing (K/W) | 0.142 | 0.129 | 0.132 | 0.14 | 0.142 | 0.132 | 0.132 | 0.145 |
| Thermal resistance before pressing (K·cm²/W) | 0.446 | 0.405 | 0.414 | 0.440 | 0.446 | 0.414 | 0.414 | 0.455 |
| Sheet thickness before pressing (mm) | 0.6 | 0.2 | 0.2 | 0.3 | 0.3 | 0.5 | 0.5 | 0.6 |
| Sheet thickness after pressing (mm) | 0.481 | 0.167 | 0.159 | 0.266 | 0.25 | 0.442 | 0.398 | 0.518 |
| Compression ratio (%) | 19.8 | 16.5 | 20.5 | 11.3 | 16.7 | 11.6 | 20.4 | 13.7 |
| Thickness at measurement (mm) | 0.498 | 0.176 | 0.141 | 0.287 | 0.272 | 0.462 | 0.409 | 0.532 |
| Thermal resistance after pressing (K/W) | 0.082 | 0.051 | 0.038 | 0.058 | 0.046 | 0.086 | 0.072 | 0.09 |
| Thermal resistance after pressing (K·cm²/W) | 0.257 | 0.160 | 0.119 | 0.182 | 0.144 | 0.270 | 0.226 | 0.283 |
| Gloss value | — | — | — | — | — | 1.2 | — | — |

|  | Example | | | | | | |
|---|---|---|---|---|---|---|---|
|  | 24 | 25 | 26 | 27 | 28 | 29 | 30 |
| Pressing temperature (° C.) | 80 | RT | RT | 40 | 40 | 80 | 80 |

TABLE 1b-continued

|  | | | | | | | |
|---|---|---|---|---|---|---|---|
| Pressing pressure (kgf/cm²) | 3 | 2 | 3 | 2 | 3 | 2 | 3 |
| Thermal resistance before pressing (K/W) | 0.148 | 0.159 | 0.158 | 0.158 | 0.159 | 0.157 | 0.158 |
| Thermal resistance before pressing (K · cm²/W) | 0.465 | 0.499 | 0.496 | 0.496 | 0.499 | 0.493 | 0.496 |
| Sheet thickness before pressing (mm) | 0.6 | 0.65 | 0.65 | 0.65 | 0.65 | 0.65 | 0.65 |
| Sheet thickness after pressing (mm) | 0.478 | 0.553 | 0.481 | 0.545 | 0.469 | 0.532 | 0.451 |
| Compression ratio (%) | 20.3 | 14.9 | 26.0 | 16.2 | 27.8 | 18.2 | 30.6 |
| Thickness at measurement (mm) | 0.513 | 0.567 | 0.505 | 0.559 | 0.498 | 0.551 | 0.466 |
| Thermal resistance after pressing (K/W) | 0.08 | 0.108 | 0.126 | 0.107 | 0.139 | 0.105 | 0.138 |
| Thermal resistance after pressing (K · cm²/W) | 0.251 | 0.339 | 0.396 | 0.336 | 0.436 | 0.330 | 0.433 |
| Gloss value | — | 0.3 | — | — | — | — | — |

TABLE 1c

|  | Example | | | | | | | | |
|---|---|---|---|---|---|---|---|---|---|
|  | 31 | 32 | 33 | 34 | 35 | 36 | 37 | 38 | 39 |
| Pressing temperature (° C.) | RT | RT | RT | RT | 40 | 40 | 40 | 40 | 80 |
| Pressing pressure (kgf/cm²) | 1 | 1 | 1 | 1 | 1 | 1 | 1 | 1 | 1 |
| Thermal resistance before pressing (K/W) | 0.127 | 0.141 | 0.132 | 0.159 | 0.130 | 0.141 | 0.132 | 0.145 | 0.143 |
| Thermal resistance before pressing (K · cm²/W) | 0.399 | 0.443 | 0.414 | 0.499 | 0.408 | 0.443 | 0.414 | 0.455 | 0.449 |
| Sheet thickness before pressing (mm) | 0.2 | 0.3 | 0.5 | 0.6 | 0.2 | 0.3 | 0.5 | 0.6 | 0.2 |
| Sheet thickness after pressing (mm) | 0.19 | 0.281 | 0.462 | 0.551 | 0.188 | 0.279 | 0.459 | 0.549 | 0.181 |
| Compression ratio (%) | 5.3 | 6.3 | 7.6 | 8.1 | 6.0 | 7.0 | 8.2 | 8.5 | 9.5 |
| Thickness at measurement (mm) | 0.188 | 0.279 | 0.458 | 0.547 | 0.184 | 0.275 | 0.456 | 0.537 | 0.178 |
| Thermal resistance after pressing (K/W) | 0.094 | 0.096 | 0.099 | 0.107 | 0.092 | 0.095 | 0.097 | 0.105 | 0.09 |
| Thermal resistance after pressing (K · cm²/W) | 0.295 | 0.301 | 0.311 | 0.336 | 0.289 | 0.298 | 0.305 | 0.330 | 0.283 |
| Gloss value | — | — | — | — | — | — | — | — | — |

|  | Example | | | | | | Comparative Example |
|---|---|---|---|---|---|---|---|
|  | 40 | 41 | 42 | 43 | 44 | 45 | 1 |
| Pressing temperature (° C.) | 80 | 80 | 80 | RT | 40 | 80 | 35 |
| Pressing pressure (kgf/cm²) | 1 | 1 | 1 | 1 | 1 | 1 |  |
| Thermal resistance before pressing (K/W) | 0.142 | 0.132 | 0.144 | 0.156 | 0.156 | 0.157 |  |
| Thermal resistance before pressing (K · cm²/W) | 0.446 | 0.414 | 0.452 | 0.490 | 0.490 | 0.493 |  |
| Sheet thickness before pressing (mm) | 0.3 | 0.5 | 0.6 | 0.65 | 0.65 | 0.65 | 0.5 |
| Sheet thickness after pressing (mm) | 0.276 | 0.457 | 0.542 | 0.594 | 0.59 | 0.58 |  |
| Compression ratio (%) | 8.0 | 8.6 | 9.7 | 8.6 | 9.2 | 11.7 |  |
| Thickness at measurement (mm) | 0.274 | 0.452 | 0.537 | 0.59 | 0.586 | 0.575 | 0.474 |

TABLE 1c-continued

| Thermal resistance after pressing (K/W) | 0.093 | 0.095 | 0.104 | 0.123 | 0.122 | 0.12 | 0.132 |
| Thermal resistance after pressing (K · cm²/W) | 0.292 | 0.298 | 0.327 | 0.386 | 0.383 | 0.377 | 0.414 |
| Gloss value | — | — | — | — | — | — | 0.1 |

TABLE 1d

| | Example | | | | | |
|---|---|---|---|---|---|---|
| | 46 | 47 | 48 | 49 | 50 | 51 |
| Average major axis length (μm) | 100 | 100 | 150 | 150 | 250 | 40 |
| Average axial diameter (μm) | 9.2 | 9.2 | 9.2 | 9.2 | 9.2 | 9.2 |
| Use of spacer | Yes | Yes | Yes | Yes | Yes | Yes |
| Thermal resistance before pressing (K/W) | 0.111 | 0.108 | 0.26 | 0.255 | 0.312 | 0.29 |
| Thermal resistance before pressing (K · cm²/W) | 0.345 | 0.339 | 0.816 | 0.801 | 0.980 | 0.92 |
| Pressing temperature (° C.) | 100 | 70 | RT | 60 | 60 | 80 |
| Pressing pressure (kgf/cm²) | 7 | 7 | 25 | 100 | 50 | 40 |
| Sheet thickness before pressing (mm) | 0.10 | 0.10 | 2.03 | 2.00 | 2.54 | 1.55 |
| Sheet thickness after pressing (mm) | 0.06 | 0.07 | 1.96 | 1.92 | 2.464 | 1.50 |
| Compression ratio (%) | 66.67 | 42.86 | 2.57 | 4.17 | 3.25 | 3.33 |
| Thickness at measurement (mm) | 0.06 | 0.07 | 2.00 | 1.95 | 2.48 | 1.48 |
| Thermal resistance after pressing (K/W) | 0.025 | 0.029 | 0.24 | 0.236 | 0.301 | 0.283 |
| Thermal resistance after pressing (K · cm²/W) | 0.079 | 0.091 | 0.754 | 0.741 | 0.945 | 0.889 |
| Gloss value | 0.1 | 0.1 | 0.2 | 0.2 | 0.2 | 0.2 |

The heat conductive sheets in Examples 1 to 45 had respective sheet thicknesses after pressing shown in TABLEs 1a to 1d and each exhibited a favorably low thermal resistance. The surface glossiness (gloss value) of each of the heat conductive sheets in Examples 6, 10, 21, and 25 subjected to surface glossiness measurement was 0.2 or higher.

As can be seen, the thermal resistance tends to decrease as the pressing pressure increases, the thermal resistance tends to increase as the pressing temperature increases, and the thermal resistance tends to increase as the sheet thickness increases.

In the heat conductive sheet in Comparative Example 1 not subjected to pressing, the thermal resistance was larger than 0.41 K·cm²/W. In addition, the gloss value was 0.1, and the surface glossiness was low.

In the heat conductive sheet in Example 46, since the spacer was used during pressing, the pressing temperature was set to be high, i.e., 100° C. In addition, since the average major axis length of the carbon fibers was relatively short, i.e., 100 μm, the compression ratio of the sheet was very high, i.e., 67%. Therefore, although the thickness of the sheet before pressing was 0.10 mm, a favorably low thermal resistance was obtained. The surface glossiness (gloss value) was 0.1 or higher.

The heat conductive sheet in Example 47 was produced by repeating the same procedure as in Example 46 except that the pressing temperature was set to 70° C. Therefore, the compression ratio was about 43%, which is lower than that in Example 46. However, although the thickness of the sheet before pressing was 0.10 mm, a favorably low thermal resistance was obtained. The surface glossiness (gloss value) was 0.1 or higher.

In the heat conductive sheets in Examples 48 to 51, the spacer was used during pressing, and the sheet thickness was relatively large. However, the pressing pressure was set to be relatively high, i.e., 1.2 to 20 MPa. Therefore, although the sheet thickness before pressing was 1.55 to 2.54 mm, a favorably low thermal resistance was obtained. The surface glossiness (gloss value) was 0.2 or higher.

In the heat conductive sheets exhibiting such a high heat conductivity, the thermal resistance before pressing was 0.1 to 0.32.

INDUSTRIAL APPLICABILITY

According to the production method of the present invention, although most of the fibrous fillers are randomly oriented after molding, the sheet is compressed during pressing after slicing, so that the fibrous fillers are in contact with each other within the sheet. Therefore, a heat conductive sheet with improved heat conduction inside the sheet can be produced. In addition, since the surface of the sheet can be smoothened, its adhesion to a heat generating body and a heat dissipator is improved. Therefore, a heat conductive sheet can be produced which exhibits favorable heat conductivity without applying a load that may interfere with the normal operation of the heat generating body and the heat dissipator to the heat generating body and the heat dissipator when the heat conductive sheet is disposed therebetween. Accordingly, the present invention is useful to produce a heat conductive sheet that is disposed between a heat generating body such as an IC chip or an IC module and a heat dissipator.

The invention claimed is:

1. A method of producing a heat conductive sheet, the method comprising:
   (A) dispersing a fibrous filler and a spherical filler in a binder resin to prepare a heat conductive sheet-forming composition;
   (B) forming a molded block using the prepared heat conductive sheet-forming composition;
   (C) slicing the formed molded block to a desired thickness to form a sheet;
   (D) pressing a sliced surface of the formed sheet, the sliced surface being pressed such that a thermal resistance value of the sheet after pressing becomes lower than the thermal resistance value of the sheet before pressing in order to smooth the sliced surface; and
   (E) then disposing the smooth sliced surface of the sheet between a heat generating body and a heat dissipator,
   wherein the fibrous filler in (A) is a carbon fiber having an average diameter in a range of 8 to 12 μm and an aspect ratio in a range of 2 to 50,
   amounts of the fibrous filler and the spherical filler added to the heat conductive sheet-forming composition are in a range of 16 to 40% by volume and in a range of 30 to 60% by volume, respectively, and
   a thermal resistance value (K·cm$^2$/W) of the sheet before pressing that is formed in (C) is controlled to be in a range of 0.31 to 1.00.

2. The production method according to claim 1, wherein in (B), the molded block is formed by an extrusion molding method or a die molding method.

3. The production method according to claim 1, wherein the binder resin in (A) is a silicone resin.

4. The production method according to claim 1, wherein, when the sheet formed in (C) has a thickness of less than 0.65 mm, the thermal resistance value (K·cm$^2$/W) of the sheet before pressing is controlled to be in a range of more than 0.31 and less than 0.47.

5. The production method according to claim 1, wherein, when the sheet formed in (C) has a thickness in a range of 0.65 mm or more and 3 mm or less, the thermal resistance value (K·cm$^2$/W) of the sheet before pressing is controlled to be in a range of more than 0.47 and less than 1.00.

6. The production method according to claim 1, wherein a pressure applied to the sheet in (D) is in a range of 1 to 8 kgf/cm$^2$.

7. The production method according to claim 1, wherein, when a spacer is used, the pressing is performed in (D) at a set pressure in a range of 0.1 to 30 MPa.

8. The production method according to claim 1, wherein the pressing is performed in (D) while heating at a glass transition temperature of the binder resin or higher.

9. The production method according to claim 1, wherein the pressing is performed in (D) so that a compression ratio of the sheet is in a range of 2 to 15%.

10. The production method according to claim 1, wherein the pressing is performed in (D) such that a glossiness of the surface of the sheet after pressing is 0.1 or higher.

11. The production method according to claim 1, wherein disposing the smooth sliced surface of the sheet between the heat generating body and the heat dissipator includes further smoothing the sliced surface.

* * * * *